United States Patent
Seevinck et al.

[11] Patent Number: 6,028,480
[45] Date of Patent: Feb. 22, 2000

[54] AMPLIFIER WITH ACTIVE-BOOTSTRAPPED GAIN-ENHANCEMENT TECHNIQUE

[75] Inventors: Evert Seevinck, Eersel, Netherlands; Monuko Du Plessis, Pretoria, South Africa

[73] Assignee: U.S. Philips Corporation, New York, N.Y.

[21] Appl. No.: 08/859,801

[22] Filed: May 19, 1997

[30] Foreign Application Priority Data

May 22, 1996 [EP] European Pat. Off. ............... 96201414

[51] Int. Cl.[7] ..................................................... H03F 3/45
[52] U.S. Cl. .......................................... 330/257; 330/253
[58] Field of Search ..................... 330/257, 253, 330/288, 277, 252, 292

[56] References Cited

U.S. PATENT DOCUMENTS

| | | | |
|---|---|---|---|
| 4,068,184 | 1/1978 | Ahmed | 330/257 |
| 4,360,785 | 11/1982 | Schade, Jr. | 330/257 |
| 4,568,885 | 2/1986 | McKenzie et al. | 330/253 |
| 4,768,619 | 9/1988 | Taylor | 330/288 |
| 4,992,755 | 2/1991 | Seevinck et al. | 330/257 |
| 5,351,011 | 9/1994 | Seevinck et al. | 330/253 |
| 5,373,248 | 12/1994 | Fernandez | 330/257 |
| 5,694,084 | 12/1997 | Sakurai | 330/288 |

*Primary Examiner*—Robert Pascal
*Assistant Examiner*—Khanh Van Nguyen
*Attorney, Agent, or Firm*—Steven R. Biren

[57] ABSTRACT

In a differential pair (P1, P2) actively loaded with a current mirror (N1, N2), a differential amplifier (A) drives the common terminal (Z) of the current mirror to force a zero voltage difference between the input terminal (X) and the output terminal (Y) of the current mirror. The voltage at the input terminal (X) is actively bootstrapped, via the differential amplifier (A), by the voltage of the output terminal (Y) with high precision. Thus a high voltage gain is obtained. A capacitor (CP) between the input terminal (X) and the control terminal (Z) compensates the local loop formed by the differential amplifier (A) and the input transistor (N1) of the current mirror, and forms a short circuit at high frequencies, thus reducing the active load of the differential pair to a conventional current mirror. For high frequencies the circuit has the same gain and phase properties as the standard non-bootstrapped approach and standard compensating techniques can be applied to the complete amplifier.

20 Claims, 6 Drawing Sheets

AMPLIFIER WITH ACTIVE-BOOTSTRAPPED GAIN-ENHANCEMENT TECHNIQUE

BACKGROUND OF THE INVENTION

1. Field of the Invention

The invention relates to an amplifier comprising: a current mirror having an mirror input terminal, a mirror output terminal, a mirror control terminal, and a common terminal; a differential transistor pair comprising first and second transistors having respective control electrodes connected to receive an input signal, and having respective output electrodes coupled to the mirror input terminal and the mirror output terminal; a differential amplifier having an non-inverting input coupled to the mirror input terminal, an inverting input to the mirror output terminal and an output coupled to the mirror control terminal; and a capacitor.

2. Description of the Related Art

Such an amplifier is known from U.S. Pat. No. 4,068,184. High gain in amplifiers is generally achieved by cascading a number of gain stages. The number of cascaded stages is limited by the need for frequency compensation to enable stable feedback. Particularly CMOS processes yield relatively low gain values. The gain per stage is then usually increased by cascading techniques. Unfortunately, cascaded circuits involve stacking of transistor voltage drops. This limits the use of cascading for low supply-voltage circuits. Another gain-enhancement technique is based on bootstrapping. In the known amplifier this bootstrapping technique would imply omitting the differential amplifier, interconnecting the mirror control terminal and the mirror input terminal, and adding a current source in series with the common terminal of the current mirror and a voltage-follower transistor which buffers the voltage at the mirror output terminal to the common terminal of the current mirror, thereby forcing nearly equal signal voltages at the mirror input terminal and the mirror output terminal. However, the current source in series with the common terminal of the current mirror causes an additional transistor voltage drop.

SUMMARY OF THE INVENTION

It is an object of the invention to provide a high-gain amplifier suitable for use at low supply voltages. An object of the invention is, therefore, to provide an amplifier with high gain characteristics. To obtain the above object, according to the present invention, the above referenced amplifier is characterized in that the capacitor is coupled between the mirror input terminal and the mirror control terminal. At low frequencies the influence of the capacitor can be neglected. The differential amplifier and the input branch of the current mirror form a local negative feedback loop. The current from the first transistor of the differential transistor pair is therefore forced to flow into the mirror input terminal. This current is mirrored in the current mirror and flows to an output terminal which is connected to the mirror output terminal. The current from the second transistor of the differential transistor pair also flows to the output terminal. Up to this point the operation is like a normal current mirror in which the mirror control terminal is connected to the mirror input terminal. The differential amplifier minimizes the voltage difference between the mirror input terminal and the mirror output terminal. The gain involved is very high as it is the product of the voltage gains of the differential amplifier and of the transistors between the mirror control terminal and the mirror input or output terminal. So the voltage at the mirror input terminal is actively bootstrapped by the voltage of the mirror output terminal with high precision. As a consequence the voltages at the output electrodes of the first and second transistors will remain closely equal and also the currents of the first and second transistors will be almost equal. It follows that the differential input voltage at the control electrodes of the first and second transistors will remain close to zero and thus the gain of the amplifier is very high. A higher frequencies the capacitor forms a short circuit between the mirror input terminal and the mirror control terminal, thus reducing the circuit arrangement to a differential pair loaded with a standard current mirror. If the capacitor were absent, the product of the voltage gains identified above would contribute a large amount of phase shift resulting in instability of the local negative feedback loop as well as instability of the complete amplifier when used with global feedback. Due to the capacitor the amplifier will have at high frequencies the same gain and phase properties as the conventional non-bootstrapped approach. It follows that standard compensating techniques can be applied to the complete amplifier notwithstanding the high gain at lower frequencies caused by the product of the voltage gains.

It is to be noted that the aforementioned United States Patent discloses a capacitor coupled between the mirror output terminal and the mirror control terminal. At high frequencies this arrangement of the capacitor causes a short circuit between the mirror output terminal and the mirror control terminal. As a consequence the high frequencies are shunted to the common terminal of the current mirror and are not available at the output terminal of the amplifier which is connected to the mirror output terminal. According to the teachings of said Patent some capacitance between the mirror output terminal and the mirror control terminal may be needed to augment the stray capacitance in the current mirror to assure stability against self-oscillatory tendencies.

The current mirror can be of any type. A minimal voltage drop is obtained with an embodiment as defined in claim 3. The third and fourth transistors form a simple current mirror having only one transistor voltage drop between the mirror input and output terminals and the common terminal. However, when the voltage drop is of less concern more sophisticated current mirror designs, such as cascaded mirrors or Wilson mirrors can be employed to improve the voltage gain of the amplifier.

The differential amplifier may be of any suitable design. However, for common mode voltages the differential amplifier may cause DC latch-up if the common mode feedback becomes positive due to non-idealities of the differential amplifier. When used in a global feedback system the DC latch Lip will be counteracted, but the tendency to latch-up still exists. In order to exclude latch-tip tendency an embodiment of the amplifier is in defined in claim 7.

The embodiment defined in claim 8 provides the advantage that the output voltage of the amplifier can swing very close to the supply voltage of the first supply terminal which usually serves as signal ground.

BRIEF DESCRIPTION OF THE DRAWINGS

The above and other features and advantages of the invention will be apparent from the following description of exemplary embodiments of the invention with reference to the accompanying drawings, in which.

Like reference symbols are employed in the drawings and in the description of the preferred embodiments to represent the same or very similar item or items.

Description of the Preferred Embodiments

Although the embodiments to be described and shown in the accompanying Figures are illustrated with CMOS transistors, the technique can also be implemented in bipolar or BiCMOS (mixed bipolar and CMOS) technologies. For bipolar transistors the control electrode, first main electrode and second main electrode correspond to the base, emitter and collector, respectively. For MOS transistors the control electrode, first main electrode and second main electrode correspond with the gate, source, and drain, respectively.

Figure 1:
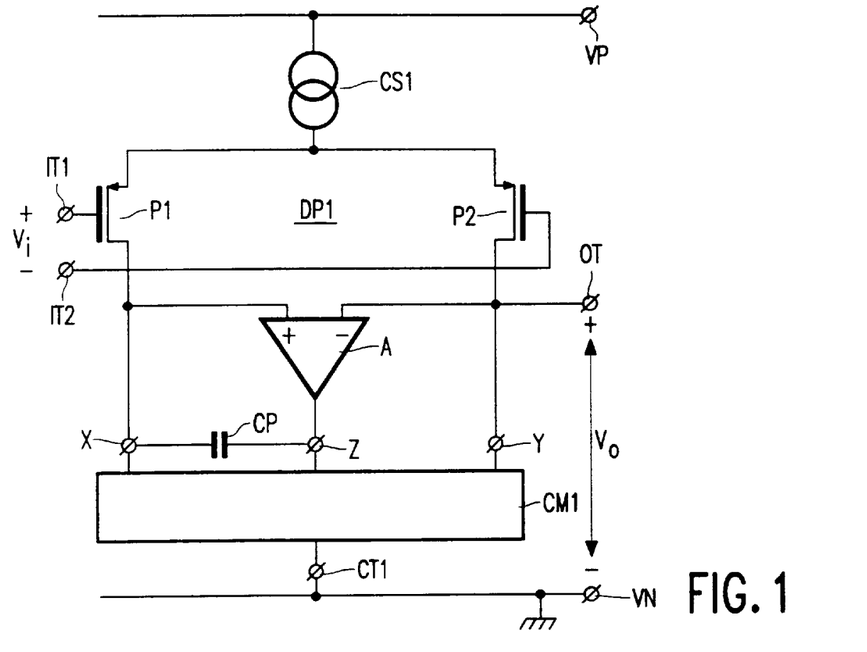
FIG. 1 is a circuit diagram of an amplifier according to the invention.

FIG. 1 shows the principle of an amplifier according to the invention employing active-bootstrapped gain-enhancement. Two PMOS transistors P1 and P2 form a differential transistor pair DP1. The common sources of transistors P1 and P2 are coupled to a positive supply terminal VP via a bias current source CS1. The respective gates of the transistors P1 and P2 are connected to signal input terminals IT1 and IT2 for receiving the input signal $v_i$. The drain of transistor P1 is coupled to a mirror input terminal X of a current mirror CM1 and the drain of transistor P2 is coupled to a mirror output terminal Y of the current mirror CM1 and to an output terminal OT of the amplifier, which output terminal provides the amplified output signal $V_o$. The current mirror CM1 has a mirror control terminal Z and a common terminal CT1 for draining the sum of the currents flowing into the mirror input terminal X, the mirror output terminal Y and the mirror control terminal Z. The common terminal CT1 is connected to a negative supply terminal VN which also serves as signal ground. In conventional current mirrors the mirror control terminal X is connected directly or via a source-to-lower to the mirror input terminal X. A differential amplifier A has its non-inverting input coupled to the mirror input terminal X, its inverting input coupled to the mirror Output terminal Y and its output coupled to the mirror control terminal Z. In addition a capacitor CP is connected between the mirror input terminal X and the mirror control terminal Z. Current mirror CM1 may be of simple or elaborated design.

Figure 2:
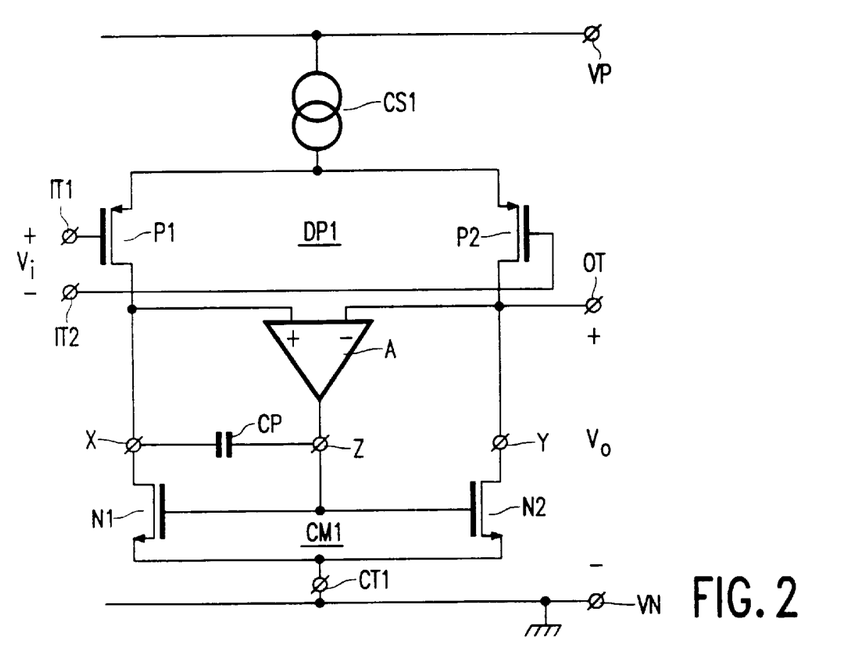
FIG. 2 is a circuit diagram of a first embodiment of an amplifier according to the invention.

FIG. 2 shows an embodiment with a simple current mirror CM1 consisting of two NMOS transistors N1 and N2. The gates of transistors N1 and N2 are interconnected and the interconnected gates are connected to the mirror control terminal Z. This embodiment has a minimum number of stacked transistor voltage drops between the positive supply terminal VP and the negative supply terminal VN. The amplifier of FIG. 2 operates as follows. First consider low-frequencies such that the influence of capacitor CP can be neglected. The differential pair DP1 delivers differential currents towards the mirror input terminal X and the mirror output terminal Y. Differential amplifier A provides signal current to the mirror control terminal Z and forms a local feedback loop together with transistor N1. The current of transistor P1 is therefore forced to flow into transistor N1. This current is mirrored in transistor N2 and flows to the output terminal OT. Also the current from transistor P2 flows to the output terminal OT. Up to this point the operation is similar to that of the conventional amplifier with a differential pair loaded with a conventional current mirror, i.e. an arrangement without capacitor CP and differential amplifier A and the mirror control terminal Z connected to the mirror input terminal X. The differential amplifier A compares the voltages at the mirror input terminal X and the mirror output terminal Y and drives the transistors N1 and N2 to minimize the voltage difference between terminals X and Y. Thus any voltage difference between the terminals X and Y is amplified and fed back as a common-mode voltage signal to the terminals X and Y. The gain involved in this differential to common-mode feedback mechanism is high as it is the product of the voltage gains of differential amplifier A and transistors N1 and N2. It follows that effectively two gain stages in cascade are operative.

Another way to visualize the operation is to note that the voltage at mirror input terminal X is bootstrapped by the voltage at mirror output terminal Y with high precision. This is active bootstrapping via differential amplifier A. The term active should be interpreted as: involving voltage -gain, contrary to passive bootstrapping involving no voltage gain.

The conventional amplifier with a differential pair loaded with a conventional current mirror, i.e. an arrangement without capacitor CP and differential amplifier A and the mirror control terminal Z connected to the mirror input terminal X can be passively bootstrapped in known manner by adding a current source in series with the common terminal CT1 and adding a source-follower transistor with its gate connected to the mirror output terminal Y and its source connected to the common terminal CT1. The source-follower transistor forces a zero voltage difference between the terminals X and Y. The source-follower transistor has a gain equal or smaller than one, so no voltage gain is involved. The extra current source in series with the common terminal CT1 adds a transistor voltage drop.

The active bootstrapping via differential amplifier A increases the output impedance of the circuit and since the output current in Output terminal OT must flow into this increased impedance the voltage gain of the circuit will be very high. The drain voltages of transistors P1, P2, N1 and N2 will remain closely equal; also the currents of transistors N1 and N2, and therefore also the currents of transistor P1 and P2 will be almost equal. It follows that the differential input voltage $V_i$ will remain close to zero. In other words, the gain of the amplifier will be very high.

Now the operation at high frequencies is considered. If capacitor CP were absent, the two gain stages identified above would contribute a large amount of phase shift, resulting in instability of the local loop consisting of differential amplifier A and transistor N1 as well as of the complete amplifier when fed back. Capacitor CP has dual functions. First it compensates the local loop consisting of differential amplifier A and transistor N1 and, second, it forms a short circuit at high frequencies thus reducing the active bootstrapping to a conventional current mirror, i.e. a current mirror CM1 with interconnected mirror input terminal X and control terminal Z. For high frequencies the amplifier will therefore have the same gain and phase properties as the standard non-bootstrapped approach. It follows that standard compensating techniques can be applied to the complete amplifier notwithstanding the effective addition of two cascaded gains.

Figure 3:
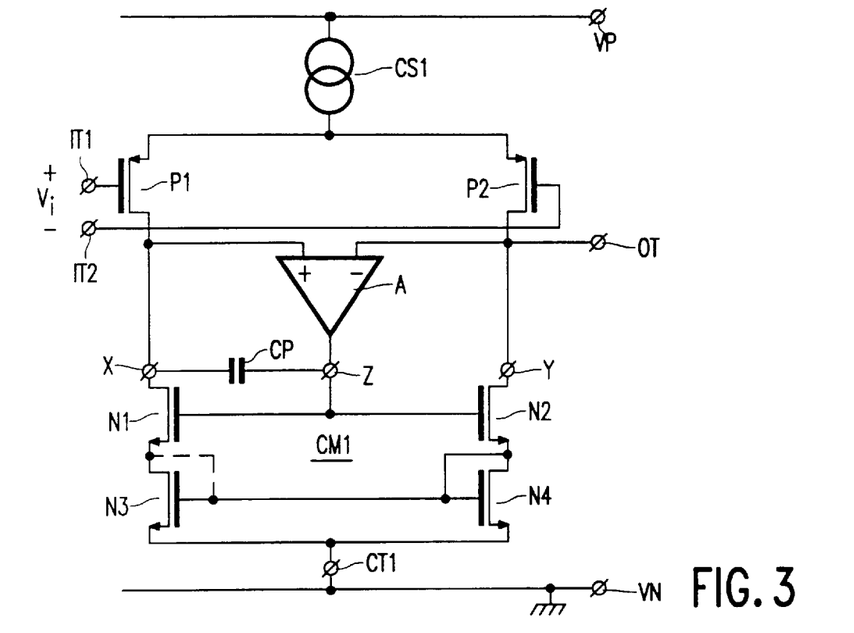
FIG. 3 is a circuit diagram of a second embodiment of an amplifier according to the invention.

When low supply voltage is of less concern, the current mirror CM1 can be more complex for improving the performance of the amplifier. FIG. 3 shows an embodiment with an improved Wilson current mirror. The source of transistor N1 is coupled to the common terminal CT1 via a NMOS transistor N3 and the source of transistor N2 is coupled to the common terminal CT1 via a NMOS transistor N4. De gates of transistors N3 and N4 are interconnected and the interconnected gates of transistors N3 and N4 are connected to the drain of transistor N4, but alternatively the interconnected gates may be connected to the drain of transistor N3, as shown with a dashed line, in place of to the drain of transistor N4.

Figure 4:
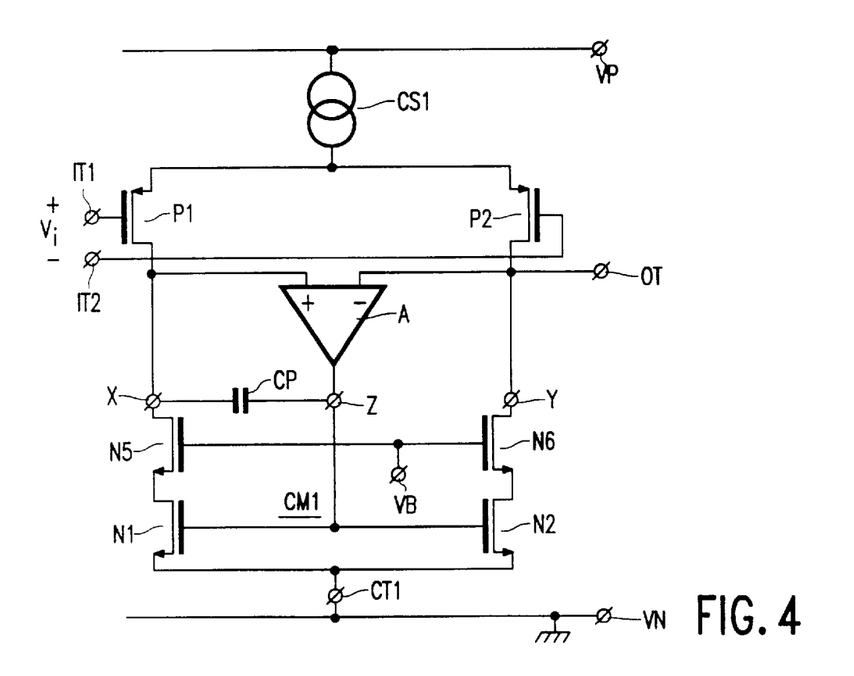
FIG. 4 is a circuit diagram of a third embodiment of an amplifier according to the invention.

FIG. 4 shows an embodiment in which the drain of transistor N1 is coupled to the mirror input terminal via a NMOS transistor N5 and in which the drain of transistor N2 is coupled to the mirror output terminal Y via a NMOS transistor N6. The gates of transistors N5 and N6 are interconnected and coupled to a bias voltage terminal VB.

Figure 5:
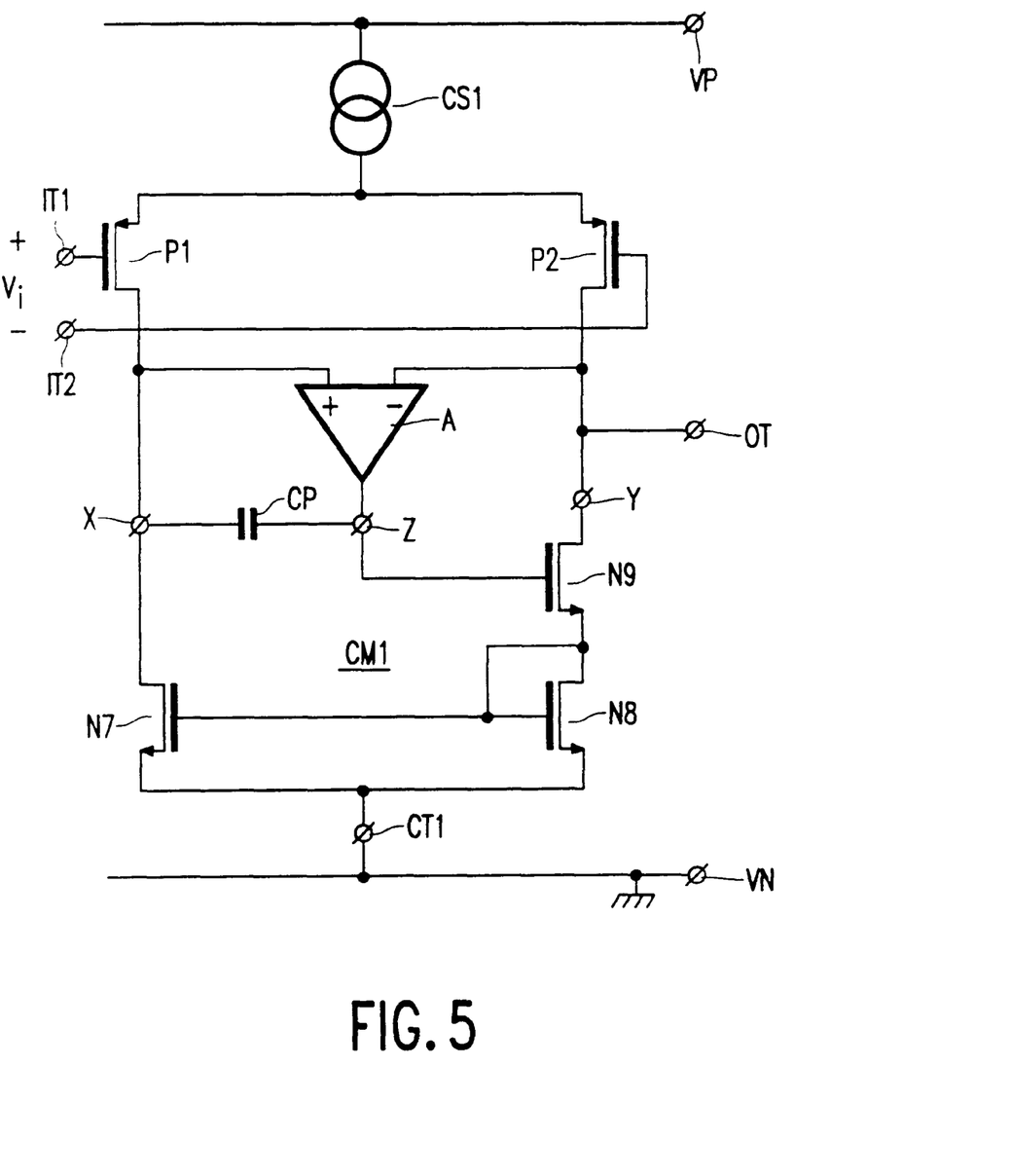
FIG. 5 is a circuit diagram of a fourth embodiment of an amplifier according to the invention.

FIG. 5 shows an embodiment with a Wilson type current mirror CM1 in which the mirror input terminal X is coupled to the common terminal CT1 via a NMOS transistor N7. Tile mirror output terminal is coupled to the common terminal CT1 via a series connection of a NNIOS transistor N9 and a NMOS transistor N8. The gate and drain of transistor N9 are coupled to the mirror control terminal Z and the mirror output terminal Y, respectively. The gates of transistors N7 and N8 are both connected to the drain of transistor N8, which drain is connected to the source of transistor N9.

Figure 6:
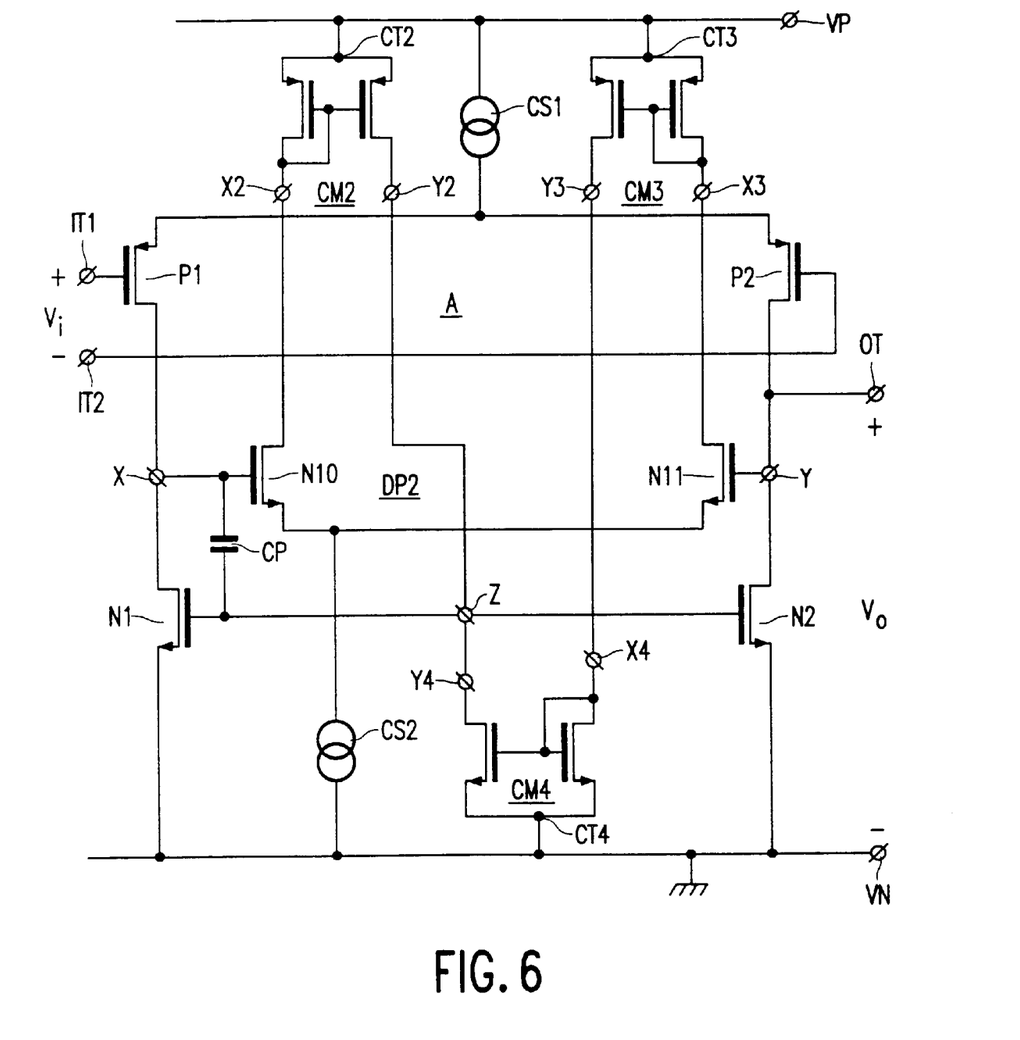
FIG. 6 is a circuit diagram of a fifth embodiment of an amplifier according to the invention.

FIG. 6 shows the same configuration as FIG. 2, but with an implementation of the differential amplifier A. The differential amplifier comprises a differential transistor pair DP2 with NMOS transistor N10 and NMOS transistor N11. The gate of transistor N10 is coupled to the mirror input terminal X, the gate of transistor N11 is coupled to the mirror output terminal Y and the common sources of the transistors N10 and N11 are coupled to the negative supply terminal VN. The drain of transistor N10 is coupled to an input terminal X2 of a current mirror CM2. An output terminal Y2 and a common terminal CT2 of current mirror CM2 are coupled to the mirror control terminal Z and the positive supply terminal VP, respectively. The drain of transistor N11 is coupled to an input terminal X3 of a current mirror CM3. A common terminal CT3 of current mirror CM3 is coupled to the positive supply terminal VP. The mirror control terminal Z is further coupled to an output terminal Y4 of a current mirror CM4. A common terminal CT4 and an input terminal X4 of current mirror CM4 are coupled to the negative supply terminal VN and an output terminal Y3 of current mirror CM3, respectively.

The differential amplifier A shown in FIG. 6 has the advantage that the common-mode gain from terminals X and Y to terminal Z is positive and therefore the common-mode feedback from terminals X and Y via terminal Z and transistors N1 and N2 back to terminals X and Y is negative, thereby preventing DC latch-up of the complete amplifier under circumstances where the feedback loop around the complete amplifier is absent or would fail or would be temporarily interrupted or malfunction.

Figure 7:
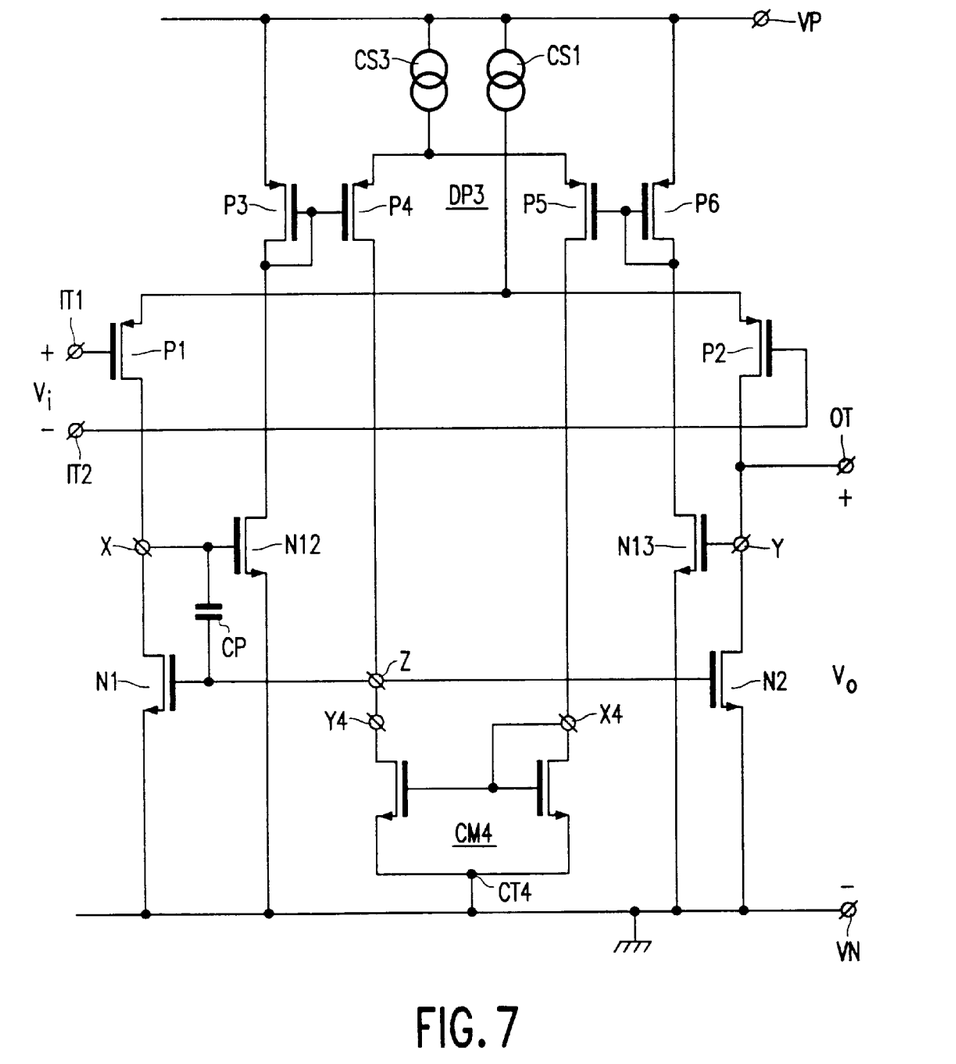
FIG. 7 is a circuit diagram of a sixth embodiment of an amplifier according to the invention.

FIG. 7 shows an alternative for the configuration of FIG. 6. The transistors N10 and N11 from FIG. 6 have been replaced by NMOS transistors N12 and N13, respectively, the sources of which are directly connected to the negative supply terminal VN. The drain of transistor N12 is coupled to the interconnected drain and gate of a PMOS transistor P3, which has its source connected to the positive supply terminal VP. Similarly the drain of transistor N13 is coupled to the interconnected drain and gate of a PMOS transistor P6, which has its source connected to the positive supply terminal VP. A differential pair DP3 comprises PMOS transistors P4 and P5, the common sources of which are coupled to the positive supply terminal VP via a current source CS3. The gate of transistor P4 is connected to the gate of transistor P3 and the drain of transistor P4 is coupled to the mirror control terminal Z and the Output terminal Y4 of current mirror CM4. The gate of transistor P5 is connected to the gate of transistor P6 and the drain of transistor P5 is coupled to the input terminal X4 of current mirror CM4. Current mirror CM4 is the same as in FIG. 6.

The voltages at terminals X and Y are copied to the drain-source interconnection nodes of transistors P3 and P4, amplified by the actively loaded transistor pair DP3/CM4 and fed back via the terminal Z and the transistors N1 and N2. The arrangement of FIG. 7 offers the advantage that the output voltage at the output terminal OT may swing closer to ground level than in the arrangement of FIG. 6 owing to the absence of current source CS2.

Figure 8:
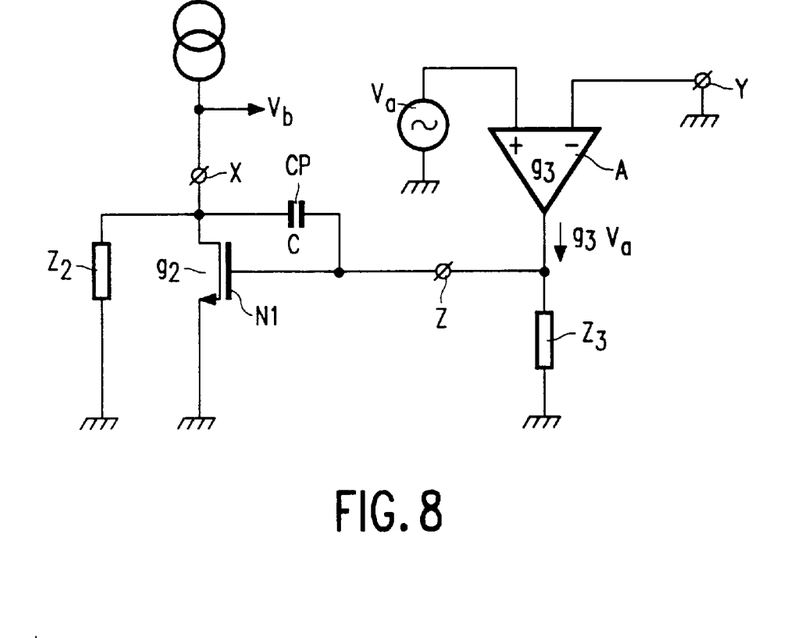
FIG. 8 shows an equivalent circuit for elucidating the operation of the amplifier according to the invention.

FIG. 8 focuses on the local feedback loop consisting of differential amplifier A and transistor N1 of the embodiment of FIG. 1. The analysis given below is given for the FIG. 1 embodiment, but similar considerations apply to the embodiments shown in the other Figures. The mirror output terminal Y is deemed connected to signal ground and the loop is opened between the mirror input terminal X and the non-inverting input of differential amplifier A. The differential amplifier A has transconductance $g_3$ and output impedance $Z_3$. Transistor N1 has transconductance $g_2$ and output impedance $Z_2$ which includes the output impedance of transistor P1. The capacitor CP between terminals X and Z has capacitance C. The equivalent circuit of FIG. 7 can be seen as a two-stage opamp with the capacitor CP being a Miller-compensation capacitor. Analysis of FIG. 8 yields the open-loop transfer function:

$$\frac{v_b}{v_a} \simeq -\frac{A_2 A_3 \left(1 - \frac{sC}{g_2}\right)}{1 + sCA_2 A_3 / g_3} \tag{1}$$

with $A_2 = g_2 Z_2$, $A_3 = g_3 Z_3$, $v_a$ the voltage at the non-inverting input of differential amplifier A, $v_b$, the voltage at mirror input terminal X and it was assumed that $A_2$ and $g_2 Z_3$ are much greater than unity.

Figure 9:
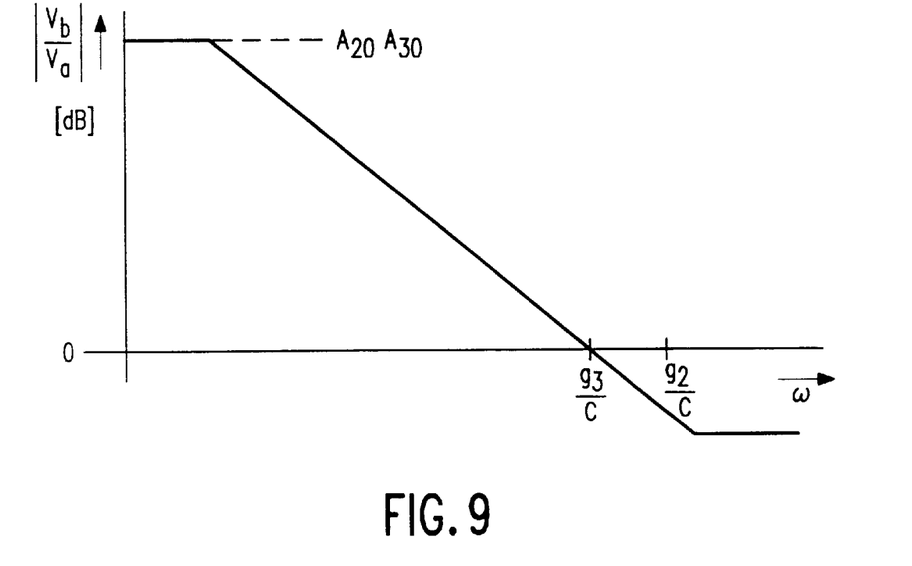
FIG. 9 shows a Bode-plot of the equivalent circuit of FIG. 8.

FIG. 9 shows the Bode-plot of the open-loop transfer function with $A_{20}$ and $A_{30}$ denoting the DC-values of $A_2$ and $A_3$. For closed-loop stability the zero (which is in the right-half s-plane) must be higher than the unity-gain frequency:

$$g_2 > g_3 \tag{2}$$

In addition, the capacitance C should be chosen large enough to ensure a first-order response in order to ensure a stable local feedback loop A, N1. In terms of the Bode-plot of FIG. 9, the slope should be –6dB/octave up to a frequency of at least $g_2/C$. The following condition then follows from equation (1):

$$\frac{\omega C}{g_3}|A_2 A_3| > 1, \omega \le \frac{g_2}{C} \qquad (3)$$

For high frequency $A_2$ and $A_3$ have magnitudes $g_2/\omega C_2$ and $g_3/\omega C_3$ respectively, with $C_2$ and $C_3$ the capacitive parts of $Z_2$ and $Z_3$. For frequency $g_2/C$, equation (3) becomes:

$$C > \sqrt{C_2 C_3} \qquad (4)$$

Therefore, capacitance C should be chosen larger than the parasitic capacitances at terminals X and Z. Together with equation (2) stability of the local loop is ensured.

We claim:

1. An amplifier comprising: a current mirror (CM1) having an mirror input terminal (X), a mirror output terminal (Y), a mirror control terminal (Z), and a common terminal (CT1); a differential transistor pair (DP1) comprising first (P1) and second (P2) transistors having respective control electrodes connected to receive an input signal, and having respective output electrodes coupled to the mirror input terminal (X) and the mirror output terminal (Y); a differential amplifier (A) having an non-inverting input (+) coupled to the mirror input terminal (X), an inverting input (−) to the mirror output terminal (Y) and an output coupled to the mirror control terminal (Z); and a capacitor (CP), characterized in that the capacitor (CP) is coupled between the mirror input terminal (X) and the mirror control terminal (Z).

2. An amplifier as claimed in claim 1, characterized in that the capacitor (CP) has a capacitance which is larger than respective parasitic capacitances at the mirror input terminal (X) and the mirror control terminal (Z).

3. An amplifier as claimed in claim 1, characterized in that the current mirror (CM1) comprises: third (N1) and fourth (N2) transistors of a second conductivity type complementary to a first conductivity type of the first (P1) and second (P2) transistors, having respective control electrodes coupled to the mirror control terminal (Z), having respective first main electrodes coupled to the common terminal (CT1), a second main electrode of the third transistor (N1) being coupled to the mirror input terminal (X), and a second main electrode of the fourth transistor (N2) being coupled to the mirror output terminal (Y).

4. An amplifier as claimed in claim 3, characterized in that the current mirror (CM1) further comprises: fifth (N3) and sixth (N4) transistors of the second conductivity type, the first main electrode of the third transistor (N1) being coupled to the common terminal (CT) via a main current path of the fifth transistor (N3), the first main electrode of the fourth transistor (N2) being coupled to the common terminal (CT1) via a main current path of the sixth transistor (N4), a control electrode of the fifth (N3) transistor and a control electrode of the sixth (N4) transistor being interconnected, and a second main electrode and the control electrode of one of the fifth (N3) and sixth (N4) transistors being interconnected.

5. An amplifier as claimed in claim 3, characterized in that the current mirror (CM1) further comprises: fifth (N5) and sixth (N6) transistors of the second conductivity type, the mirror input terminal (X) being coupled to the second main electrode of the third transistor (N1) via a main current path of the fifth transistor (N5), the mirror output terminal (Y) being coupled to the second main electrode of the fourth transistor (N2) via a main current path of the sixth transistor (N6), and the respective control electrodes of the fifth (N5) and sixth (N6) transistors being interconnected to receive a bias voltage.

6. An amplifier as claimed in claim 1, characterized in that the current mirror (CM1) comprises: third (N7), fourth (N9) and fifth (N8) transistors of a second conductivity type complementary to a first conductivity type of the first (P1) and second (P2) transistors, the mirror input terminal (X) being coupled to the common terminal (CT1) via a main current path of the third transistor (N7), the fourth transistor (N9) having a second main electrode coupled to the mirror output terminal (Y), a control electrode coupled to the mirror control terminal (Z), and a first main electrode coupled to the common terminal (CT1) via a main current path of the fifth transistor (N8), a control electrode of the third (N7) transistor and a control electrode of the fifth (N8) transistor being interconnected, and a second main electrode and the control electrode of the fifth transistor (N8) being interconnected.

7. An amplifier as claimed in claim 1, characterized in that the differential amplifier (A) comprises: a further differential transistor pair (DP2) comprising third (N10) and fourth (N11) transistors of a conductivity type complementary to a conductivity type of the first (P1) and second (P2) transistors, a control electrode of the third transistor (N 10) being coupled to the mirror input terminal (X) and a control electrode of the fourth transistor (N11) being coupled to the mirror output terminal (Y); a first further current mirror (CM2) having an input terminal (X2) coupled to a second main terminal of the third transistor (N10), an output terminal (Y2) coupled to the mirror control terminal (Z) and a common terminal (CT2) coupled to a first supply terminal (VP); a second further current mirror (CM3) having an input terminal (X3) coupled to a second main terminal of the fourth transistor (N11), an output terminal (Y3), and a common terminal (CT3) coupled to the first supply terminal (VP); and a third further current mirror (CM4) having an input terminal (X4) coupled to the output terminal (Y3) of the second further current mirror (CM3), an output terminal (Y4) coupled to the mirror control terminal (Z) and a common terminal (CT4) coupled to a second supply terminal (VN).

8. An amplifier as claimed in claim 1, characterized in that the differential amplifier (A) comprises: third (N12) and fourth (N13) transistors of a conductivity type complementary to a conductivity type of the first (P1) and second (P2) transistors, a control electrode of the third transistor (N12) being coupled to the mirror input terminal (X) and a control electrode of the fourth transistor (N13) being coupled to the mirror output terminal (Y), respective first main electrodes of the third (N12) and fourth (N13) transistors being coupled to a first supply terminal (VN); fifth (P3), sixth (P4), seventh (P5) and eighth (P6) transistors of the same conductivity type of the first (P1) and second (P2) transistors, a control electrode and a second main electrode of the fifth transistor (P3) being coupled to a second main electrode of the third transistor (N12) and to a control electrode of the sixth (P4) transistor, a control electrode and a second main electrode of the eighth transistor (P6) being coupled to the second main electrode of the fourth transistor (N13) and to a control electrode of the seventh transistor (P5), respective first main electrodes of the fifth (P3) and eighth (P6) transistors being coupled to a second supply terminal (VP), respective first main electrodes of the sixth (P4) and seventh (P5) transistors being coupled to the second supply terminal via a current source (CS3); and a further current mirror (CM4) having an input terminal (X4) coupled to a second main electrode of the seventh transistor (P5), an output terminal (Y4) coupled to a second main electrode of the sixth transistor (P4) and to the mirror control terminal (Z), and a common terminal (CT4) coupled to the first supply terminal (VN).

9. An amplifier as claimed in claim 2, characterized in that the current mirror (CM1) comprises: third (N1) and fourth (N2) transistors of a second conductivity type complementary to a first conductivity type of the first (P1) and second (P2) transistors, having respective control electrodes coupled to the mirror control terminal (Z), having respective first main electrodes coupled to the common terminal (CT1), a second main electrode of the third transistor (N1) being coupled to the mirror input terminal (X), and a second main electrode of the fourth transistor (N2) being coupled to the mirror output terminal (Y).

10. An amplifier as claimed in claim 9, characterized in that the current mirror (CM1) further comprises: fifth (N3) and sixth (N4) transistors of the second conductivity type, the first main electrode of the third transistor (N1) being coupled to the common terminal (CT) via a main current path of the fifth transistor (N3), the first main electrode of the fourth transistor (N2) being coupled to the common terminal (CT1) via a main current path of the sixth transistor (N4), a control electrode of the fifth (N3) transistor and a control electrode of the sixth (N4) transistor being interconnected, and a second main electrode and the control electrode of one of the fifth (N3) and sixth (N4) transistors being interconnected.

11. An amplifier as claimed in claim 9, characterized in that the current mirror (CM1) further comprises: fifth (N5) and sixth (N6) transistors of the second conductivity type, the mirror input terminal (X) being coupled to the second main electrode of the third transistor (N1) via a main current path of the fifth transistor (N5), the mirror output terminal (Y) being coupled to the second main electrode of the fourth transistor (N2) via a main current path of the sixth transistor (N6), and the respective control electrodes of the fifth (N5) and sixth (N6) transistors being interconnected to receive a bias voltage.

12. An amplifier as claimed in claim 2, characterized in that the current mirror (CM1) comprises: third (N7), fourth (N9) and fifth (N8) transistors of a second conductivity type complementary to a first conductivity type of the first (P1) and second (P2) transistors, the mirror input terminal (X) being coupled to the common terminal (CT1) via a main current path of the third transistor (N7), the fourth transistor (N9) having a second main electrode coupled to the mirror output terminal (Y), a control electrode coupled to the mirror control terminal (Z), and a first main electrode coupled to the common terminal (CT1) via a main current path of the fifth transistor (N8), a control electrode of the third (N7) transistor and a control electrode of the fifth (N8) transistor being interconnected, and a second main electrode and the control electrode of the fifth (N8) being interconnected.

13. An amplifier as claimed in claim 2, characterized in that the differential amplifier (A) comprises: a further differential transistor pair (DP2) comprising third (N10) and fourth (N11) transistors of a conductivity type complementary to a conductivity type of the first (P1) and second (P2) transistors, a control electrode of the third transistor (N10) being coupled to the mirror input terminal (X) and a control electrode of the fourth transistor (N11) being coupled to the mirror output terminal (Y); a first further current mirror (CM2) having an input terminal (X2) coupled to a second main terminal of the third transistor (N10), an output terminal (Y2) coupled to the mirror control terminal (Z) and a common terminal (CT2) coupled to a first supply terminal (VP); a second further current mirror (CM3) having an input terminal (X3) coupled to a second main terminal of the fourth transistor (N11), an output terminal (Y3), and a common terminal (CT3) coupled to the first supply terminal (VP); and a third further current mirror (CM4) having an input terminal (X4) coupled to the output terminal (Y3) of the second further current mirror (CM3), an output terminal (Y4) coupled to the mirror control terminal (Z) and a common terminal (CT4) coupled to a second supply terminal (VN).

14. An amplifier as claimed in claim 3, characterized in that the differential amplifier (A) comprises: a further differential transistor pair (DP2) comprising third (N10) and fourth (N11) transistors of a conductivity type complementary to a conductivity type of the first (P1) and second (P2) transistors, a control electrode of the third transistor (N10) being coupled to the mirror input terminal (X) and a control electrode of the fourth transistor (N11) being coupled to the mirror output terminal (Y); a first further current mirror (CM2) having an input terminal (X2) coupled to a second main terminal of the third transistor (N10), an output terminal (Y2) coupled to the mirror control terminal (Z) and a common terminal (CT2) coupled to a first supply terminal (VP); a second further current mirror (CM3) having an input terminal (X3) coupled to a second main terminal of the fourth transistor (N11), an output terminal (Y3), and a common terminal (CT3) coupled to the first supply terminal (VP); and a third further current mirror (CM4) having an input terminal (X4) coupled to the output terminal (Y3) of the second further current mirror (CM3), an output terminal (Y4) coupled to the mirror control terminal (Z) and a common terminal (CT4) coupled to a second supply terminal (VN).

15. An amplifier as claimed in claim 4, characterized in that the differential amplifier (A) comprises: a further differential transistor pair (DP2) comprising third (N10) and fourth (N11) transistors of a conductivity type complementary to a conductivity type of the first (P1) and second (P2) transistors, a control electrode of the third transistor (N10) being coupled to the mirror input terminal (X) and a control electrode of the fourth transistor (N11) being coupled to the mirror output terminal (Y); a first further current mirror (CM2) having an input terminal (X2) coupled to a second main terminal of the third transistor (N10), an output terminal (Y2) coupled to the mirror control terminal (Z) and a common terminal (CT2) coupled to a first supply terminal (VP); a second further current mirror (CM3) having an input terminal (X3) coupled to a second main terminal of the fourth transistor (N11), an output terminal (Y3), and a common terminal (CT3) coupled to the first supply terminal (VP); and a third further current mirror (CM4) having an input terminal (X4) coupled to the output terminal (Y3) of the second further current mirror (CM3), an output terminal (Y4) coupled to the mirror control terminal (Z) and a common terminal (CT4) coupled to a second supply terminal (VN).

16. An amplifier as claimed in claim 11, characterized in that the differential amplifier (A) comprises: a further differential transistor pair (DP2) comprising third (N10) and fourth (N11) transistors of a conductivity type complementary to a conductivity type of the first (P1) and second (P2) transistors, a control electrode of the third transistor (N10) being coupled to the mirror input terminal (X) and a control electrode of the fourth transistor (N11) being coupled to the mirror output terminal (Y); a first further current mirror (CM2) having an input terminal (X2) coupled to a second main terminal of the third transistor (N10), an output terminal (Y2) coupled to the mirror control terminal (Z) and a common terminal (CT2) coupled to a first supply terminal (VP); a second further current mirror (CM3) having an input terminal (X3) coupled to a second main terminal of the fourth transistor (N11), an output terminal (Y3), and a common terminal (CT3) coupled to the first supply terminal (VP); and a third further current mirror (CM4) having an input terminal (X4) coupled to the output terminal (Y3) of the second further current mirror (CM3), an output terminal (Y4) coupled to the mirror control terminal (Z) and a common terminal (CT4) coupled to a second supply terminal (VN).

17. An amplifier as claimed in claim 2, characterized in that the differential amplifier (A) comprises: third (N12) and fourth (N13) transistors of a conductivity type complementary to a conductivity type of the first (P1) and second (P2) transistors, a control electrode of the third transistor (N12) being coupled to the mirror input terminal (X) and a control electrode of the fourth transistor (N13) being coupled to the mirror output terminal (Y), respective first main electrodes of the third (N12) and fourth (N13) transistors being coupled to a first supply terminal (VN); fifth (P3), sixth (P4), seventh (P5) and eighth (P6) transistors of the same conductivity type of the first (P1) and second (P2) transistors, a control electrode and a second main electrode of the fifth transistor (P3) being coupled to a second main electrode of the third transistor (N12) and to a control electrode of the sixth (P4) transistor, a control electrode and a second main electrode of the eighth transistor (P6) being coupled to the second main electrode of the fourth transistor (N13) and to a control electrode of the seventh transistor (P5), respective first main electrodes of the fifth (P3) and eighth (P6) transistors being coupled to a second supply terminal (VP), respective first main electrodes of the sixth (P4) and seventh (P5) transistors being coupled to the second supply terminal via a current source (CS3); and a further current mirror (CM4) having an input terminal (X4) coupled to a second main electrode of the seventh transistor (P5), an output terminal (Y4) coupled to a second main electrode of the sixth transistor (P4) and to the mirror control terminal (Z), and a common terminal (CT4) coupled to the first supply terminal (VN).

18. An amplifier as claimed in claim 5, characterized in that the differential amplifier (A) comprises: third (N12) and fourth (N13) transistors of a conductivity type complementary to a conductivity type of the first (P1) and second (P2) transistors, a control electrode of the third transistor (N12) being coupled to the mirror input terminal (X) and a control electrode of the fourth transistor (N13) being coupled to the mirror output terminal (Y), respective first main electrodes of the third (N12) and fourth (N13) transistors being coupled to a first supply terminal (VN); fifth (P3), sixth (P4), seventh (P5) and eighth (P6) transistors of the same conductivity type of the first (P1) and second (P2) transistors, a control electrode and a second main electrode of the fifth transistor (P3) being coupled to a second main electrode of the third transistor (N12) and to a control electrode of the sixth (P4) transistor, a control electrode and a second main electrode of the eighth transistor (P6) being coupled to the second main electrode of the fourth transistor (N13) and to a control electrode of the seventh transistor (P5), respective first main electrodes of the fifth (P3) and eighth (P6) transistors being coupled to a second supply terminal (VP), respective first main electrodes of the sixth (P4) and seventh (P5) transistors being coupled to the second supply terminal via a current source (CS3); and a further current mirror (CM4) having an input terminal (X4) coupled to a second main electrode of the seventh transistor (P5), an output terminal (Y4) coupled to a second main electrode of the sixth transistor (P4) and to the mirror control terminal (Z), and a common terminal (CT4) coupled to the first supply terminal (VN).

19. An amplifier as claimed in claim 11, characterized in that the differential amplifier (A) comprises: third (N12) and fourth (N13) transistors of a conductivity type complementary to a conductivity type of the first (P1) and second (P2) transistors, a control electrode of the third transistor (N12) being coupled to the mirror input terminal (X) and a control electrode of the fourth transistor (N13) being coupled to the mirror output terminal (Y), respective first main electrodes of the third (N12) and fourth (N13) transistors being coupled to a first supply terminal (VN); fifth (P3), sixth (P4), seventh (P5) and eighth (P6) transistors of the same conductivity type of the first (P1) and second (P2) transistors, a control electrode and a second main electrode of the fifth transistor (P3) being coupled to a second main electrode of the third transistor (N12) and to a control electrode of the sixth (P4) transistor, a control electrode and a second main electrode of the eighth transistor (P6) being coupled to the second main electrode of the fourth transistor (N13) and to a control electrode of the seventh transistor (P5), respective first main electrodes of the fifth (P3) and eighth (P6) transistors being coupled to a second supply terminal (VP), respective first main electrodes of the sixth (P4) and seventh (P5) transistors being coupled to the second supply terminal via a current source (CS3); and a further current mirror (CM4) having an input terminal (X4) coupled to a second main electrode of the seventh transistor (P5), an output terminal (Y4) coupled to a second main electrode of the sixth transistor (P4) and to the mirror control terminal (Z), and a common terminal (CT4) coupled to the first supply terminal (VN).

20. An amplifier as claimed in claim 12, characterized in that the differential amplifier (A) comprises: third (N12) and fourth (N13) transistors of a conductivity type complementary to a conductivity type of the first (P1) and second (P2) transistors, a control electrode of the third transistor (N12) being coupled to the mirror input terminal (X) and a control electrode of the fourth transistor (N13) being coupled to the mirror output terminal (Y), respective first main electrodes of the third (N12) and fourth (N13) transistors being coupled to a first supply terminal (VN); fifth (P3), sixth (P4), seventh (P5) and eighth (P6) transistors of the same conductivity type of the first (P1) and second (P2) transistors, a control electrode and a second main electrode of the fifth transistor (P3) being coupled to a second main electrode of the third transistor (N12) and to a control electrode of the sixth (P4) transistor, a control electrode and a second main electrode of the eighth transistor (P6) being coupled to the second main electrode of the fourth transistor (N13) and to a control electrode of the seventh transistor (P5), respective first main electrodes of the fifth (P3) and eighth (P6) transistors being coupled to a second supply terminal (VP), respective first main electrodes of the sixth (P4) and seventh (P5) transistors being coupled to the second supply terminal via a current source (CS3); and a further current mirror (CM4) having an input terminal (X4) coupled to a second main electrode of the seventh transistor (P5), an output terminal (Y4) coupled to a second main electrode of the sixth transistor (P4) and to the mirror control terminal (Z), and a common terminal (CT4) coupled to the first supply terminal (VN).

* * * * *